United States Patent [19]

Hoshino

[11] Patent Number: 5,227,729
[45] Date of Patent: Jul. 13, 1993

[54] FUSION DETECTING SYSTEM FOR RELAYS

[75] Inventor: Yoshinori Hoshino, Shinagawa, Japan

[73] Assignee: Fanuc Ltd, Minamitsuru, Japan

[21] Appl. No.: 674,327

[22] PCT Filed: Aug. 29, 1990

[86] PCT No.: PCT/JP90/01095
§ 371 Date: Apr. 15, 1991
§ 102(e) Date: Apr. 15, 1991

[87] PCT Pub. No.: WO91/03741
PCT Pub. Date: Mar. 21, 1991

[30] Foreign Application Priority Data
Sep. 1, 1989 [JP] Japan .................. 1-226728

[51] Int. Cl.⁵ .............. G01R 31/02; G08B 21/00
[52] U.S. Cl. ................... 324/423; 324/418; 340/644
[58] Field of Search ........... 324/418, 423; 340/644; 361/42; 307/137; 200/DIG. 42

[56] References Cited

U.S. PATENT DOCUMENTS

| | | | |
|---|---|---|---|
| 3,548,399 | 12/1970 | Monigal et al. | 340/644 |
| 3,575,607 | 4/1971 | Edstrom | 324/418 |
| 3,587,096 | 6/1971 | Teichmann | 340/644 |
| 4,516,076 | 5/1985 | Pillari et al. | 324/418 |
| 4,546,224 | 10/1985 | Mostosi | 200/DIG. 42 |
| 4,645,886 | 2/1987 | Williams | 200/DIG. 42 |
| 4,647,727 | 3/1987 | Sontheimer | 200/DIG. 42 |
| 4,767,941 | 8/1988 | Brand et al. | 324/418 |
| 4,914,315 | 4/1990 | Nickolai | 307/137 |

FOREIGN PATENT DOCUMENTS
0007420 2/1980 European Pat. Off. .

OTHER PUBLICATIONS
Patent Abstracts of Japan, vol. 5, No. 183 (M-097), Nov. 21, 1981; & JP-A-56 103 013 (Mitsubishi) Aug. 17, 1981.
Patent Abstracts of Japan, vol. 11, No. 254 (E-533), Aug. 18, 1987; & JP-A-62 064 (Sumitomo) Mar. 23, 1987.

Primary Examiner—Kenneth A. Wieder
Assistant Examiner—Maura K. Regan
Attorney, Agent, or Firm—Staas & Halsey

[57] ABSTRACT

A fusion detecting system for relays is provided for detecting a fusion of relay contacts. Two fully-interlocked or semi-interlocked relays are connected in such a manner that they operate under identical conditions, and a fused state is detected based on the states of signals sent from series-connected make contacts and series-connected break contacts of the two relays. In the case of semi-interlocked relays (R1, R2), if a make contact (r12) is fused during a current supply to a coil, the other contact (r22) remains in an open state or at a make-contact side after the current supply to the coil is cut off, and if a break contact (r11) is fused, the other contact (r21) remains in an open state or at break-contact side after a current is supplied to the relay coil. Accordingly, by using two semi-interlocked relays under identical conditions and connecting same such that the make contacts and the break contacts are individually connected in series, a fusion of the relays can be detected based on signals sent from the contacts. A fusion of fully-interlocked relays can be detected in a like manner.

4 Claims, 3 Drawing Sheets

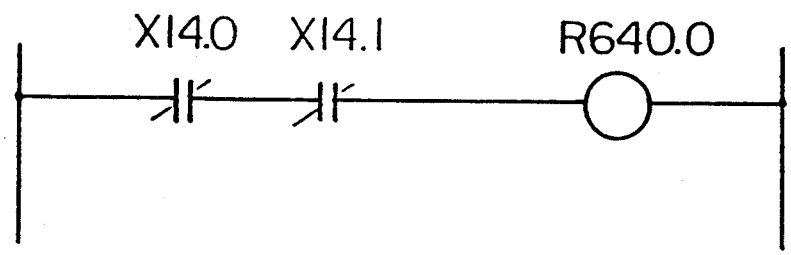
F I G. 2

|         | NORMAL       |             | ABNORMAL     |             |
|---------|--------------|-------------|--------------|-------------|
|         | E BUTTON OFF | E BUTTON ON | E BUTTON OFF | E BUTTON ON |
| r12     | 1            | 0           | 0̿           | 0           |
| r22     | 1            | 0           | 1            | 0           |
| X14.0   | 1            | 0           | 0            | 0           |
| *X14.0  | 0            | 1           | 1            | 1           |
| *r13    | 0            | 1           | 0            | 0̿           |
| *r23    | 0            | 1           | 0            | 1           |
| X14.1   | 0            | 1           | 0            | 0           |
| *X14.1  | 1            | 0           | 1            | 1           |
| R640.0  | 0            | 0           | 1̲           | 1̲           |

FUSION DETECTING SYSTEM FOR RELAYS

DESCRIPTION

1. Technical Field

This invention relates to a fusion detecting system for relays for detecting a fusion of relay contacts, and more particularly, to a fusion detecting system for relays for detecting a fusion thereof by using semi-interlocked or fully-interlocked relays.

1. Background Art

Contacts of relays, magnets, or the like are sometimes fused together by an extreme current overload or contamination due to long use, and if these relays or magnets are used to produce a safety signal for a PC (programmable controller), etc. which controls a machine tool, for example, an emergency stop signal, or an interlock signal associated with a splash guard of the machine tool, the operator may be exposed to unexpected danger. Accordingly, to avoid this danger, semi-interlocked or fully-interlocked relays are used.

In semi-interlocked relays, if a make contact is fused during a current supply to the coil, the other contact is held in an open state or at a make-contact side after the current supply to the coil is cut off. On the other hand, if a break contact is fused, the other contact is held in an open state or at a break-contact side after a current supply to the relay coil is started.

In fully-interlocked relays, if a make contact is fused during a current supply to the coil, the other contact is held in a make-contact state after the current supply to the coil is cut off, and if a break contact is fused, the other contact is held in a break-contact state after a current supply to the relay coil is started.

Nevertheless, even when these relays are used, danger cannot be avoided if the fused contact is used to produce an emergency stop signal or the like.

Usually, the movement of the contacts of these relays, etc., is too minute to be observed with the naked eye, and since the relays are generally housed in the casing of a control device, the movement or non-movement of a contact cannot be determined from the outside.

DISCLOSURE OF THE INVENTION

This invention has been created in view of the above circumstances, and an object thereof is to provide a fusion detecting system for relays by which a fusion of relays can be reliably detected.

To achieve the above object, according to this invention, there is provided a fusion detecting system for relays wherein two fully-interlocked or semi-interlocked relays are connected in such a manner that they operate under identical conditions, and a fused state is detected based on the states of signals sent from series-connected make contacts and series-connected break contacts of the two relays.

In semi-interlocked relays, if a make contact is fused during a current supply to the coil, the other contact is held in an open state or at a make-contact side after the current supply to the coil is cut off, and if a break contact is fused, the other contact is held in an open state or at a break-contact side after a current is supplied to the relay coil.

In fully-interlocked relays, if a make contact is fused during a current supply to the coil, the other contact is held in a make-contact state after the current supply to the coil is cut off; if a break contact is fused, the other contact is held in a break-contact state after a current is supplied to the relay coil.

Accordingly, two semi-interlocked or fully-interlocked relays are used under identical conditions, the make contacts and break contacts of the relays are individually connected in series, and signals sent therethrough are checked to thereby detect a fusion of the relays.

BRIEF DESCRIPTION OF THE DRAWINGS

FIG. 2 is a diagram illustrating a ladder program for detecting a fusion of relays; and FIG. 3 is a diagram of a logic table used for detecting a fusion of relays.

BEST MODE OF CARRYING OUT THE INVENTION

Figure 1:
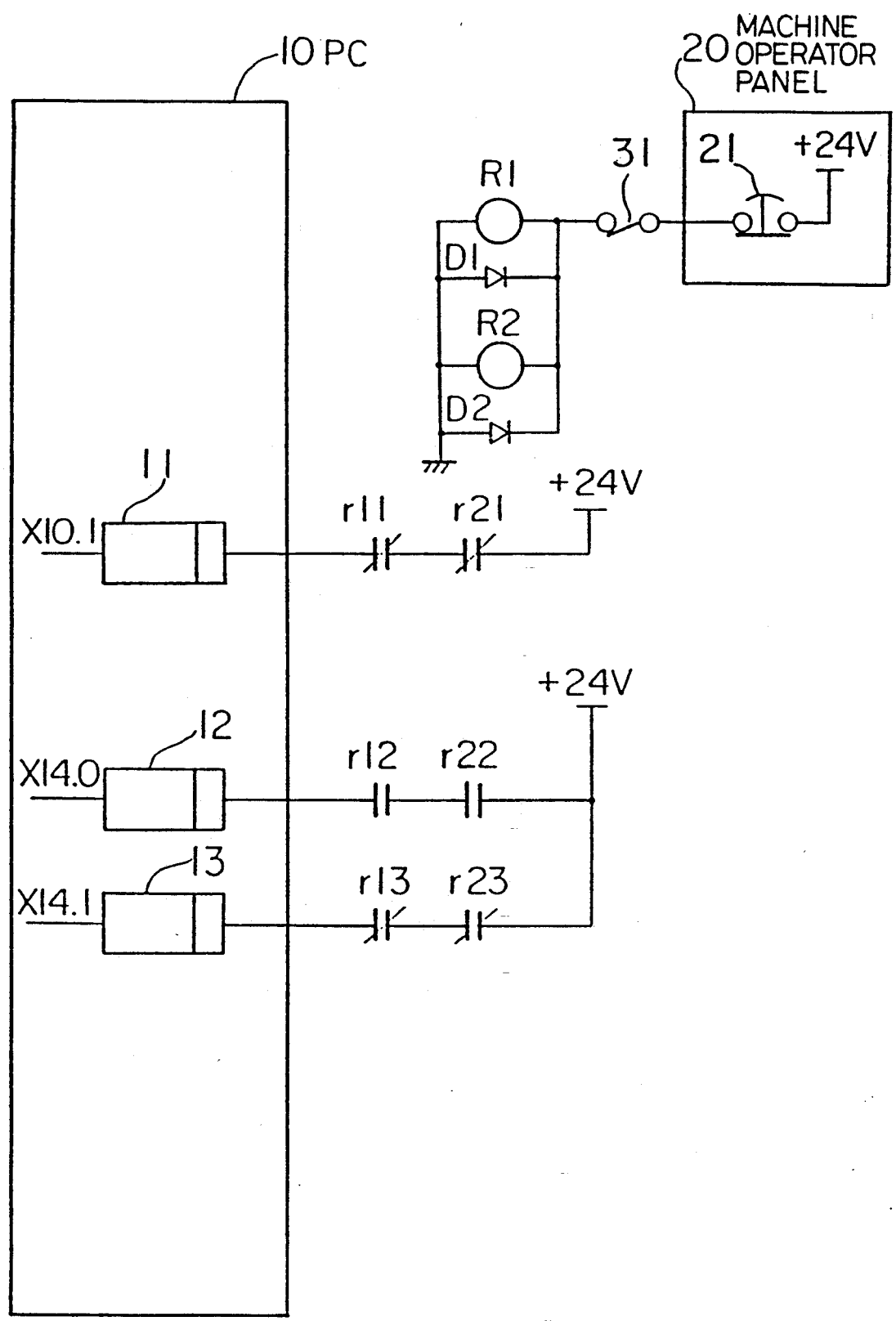
FIG. 1 is a circuit diagram illustrating a relay checking system according to this invention.

One embodiment of this invention will be described with reference to the drawings.

FIG. 1 is a circuit diagram showing a relay checking system according to this invention, in which a PC (programmable controller) 10 includes receivers 11, 12 and 13 for receiving signals input thereto from outside, and processes these signals in accordance with a sequence program, to provide a signal for controlling a machine. These control operations are carried out by a microprocessor, but elements other than the receivers are omitted from the figure for simplicity.

An emergency stop button 21 of a machine operator panel 20 is connected to relays R1 and R2 through a contact 31. The relays R1 and R2 are connected in parallel with diodes D1 and D2, respectively. The contact 31 serves as a signal contact for an emergency stop, for example, a contact actuated when the machine reaches a stroke end. In practice, a plurality of emergency stop conditions are included and a large number of contacts are connected in series, but the contact 31 alone is illustrated in the figure, for simplicity.

Semi-interlocked relays or fully-interlocked relays can be used for the relays R1 and R2; here it is assumed that semi-interlocked relays are used. A break contact r11 of the relay R1 and a break contact r21 of the relay R2 are connected in series, and are connected to the receiver 11. Namely, when the emergency stop button 21 is pressed, the relays R1 and R2 are turned off with the break contacts r11 and r12 thereof open, and thus an emergency stop signal is input to the receiver 11 of the PC 10, whereby an emergency stop state is established and an outside operation is interrupted.

The receiver 12 is connected in series with make contacts r12 and r22 of the relays R1 and R2, and the receiver 13 is connected in series with break contacts r13 and r23 of the relays R1 and R2.

The letters and numbers on the left of the receivers 11, 12 and 13 represent addresses for the respective input signals.

FIG. 2 shows a ladder program for detecting a fusion of relays, wherein a logical sum of the input signal (X14.0) to the receiver 12 and the input signal (X14.1) to the receiver 13 through the break contacts is connected to a coil (R640.0); when a fusion of the contacts occurs, the coil (R640.0) is made "1."

FIGS. 3 is a diagram of a logic table for detecting a fusion of relays. In a normal state, when the emergency stop button 21 (indicated in FIG. 3 as E button) is off, the make contacts r12 and r22 are on ("1"), the input signal X14.0 is on and a negative signal thereof (indicated by "*" in the figure) is "0," when the break contacts r13 and r23 are off ("0"), the input signal X14.1 is "0" and a negative signal thereof *X14.1 is "1," and accordingly, a signal (R640.0) which indicates a fusion of the contacts is "0."

Also when the emergency stop button 21 is on, the signal (R640.0) is "0."

If a fusion of the break contact of the relay (R1) occurs while the emergency stop button 21 is off, the emergency stop button 21 is made on and the make contact r12 of the relay (R1), which originally should be on, is made off ("0"), whereby the signal (R640.0) becomes "1" and thus the fusion state is detected.

Similarly, if a fusion of the make contact of the relay (R1) occurs while the emergency stop button 21 is on, the emergency stop button 21 is made off and the break contact r13 of the relay (R1), which originally should be on, is made off ("0"). Accordingly, the signal (R640.0) becomes "1" and the fusion state can be detected.

Therefore, as described above, a fusion of the contacts can be reliably detected.

In the above example, semi-interlocked relays are mentioned, but these can be replaced by fully-interlocked relays.

Further, in the above description, a signal of the emergency stop button is exemplified, but the foregoing applies to the use of any other signals relating to safety, such as an interlock signal of a machine tool which is used to interlock the control device when the splash guard of the machine tool is not closed.

As described above, according to this invention, a fusion of the relay contacts is detected by using semi-interlocked or fully-interlocked relays, whereby a fusion of the relays can be reliably detected and the reliability of the machine tool, etc., is improved.

I claim:

1. A relay arrangement including a system for detecting fused contacts, said arrangement comprising:
   a pair of a relays,
   each said relay having a main set of contacts, a first set of signal contacts which are normally open when the main contacts are closed and normally closed when the main contacts are open, and a second set of signal contacts which are normally open when the main contacts are open and normally closed when the main contacts are closed,
   said first sets of signal contacts being electrically connected in series,
   said second sets of signal contacts being electrically connected in series; and
   detection means electrically connected to the series connected first sets of signal contacts and the series connected second sets of contacts for detecting when a set of signal contacts is in a improper open or closed condition as an indication that the contacts of a set of main contacts have fused together, said detection means including a programmable controller which provides said indication in accordance with a ladder program.

2. A relay arrangement including a system for detecting fused contacts, said arrangement comprising:
   a first relay;
   a second relay,
   each of said relays including a main set of contacts and a signal contact mechanism comprising a set of break contacts which are normally open when the main contacts are closed and normally closed when the main contacts are open, and a set of make contacts which are normally open when the main contacts are open and normally closed when the main contacts are closed,
   said set of break contacts of said first relay being electrically connected in series with said set of break contacts of said second relay,
   said set of make contacts of said first relay being electrically connected in series with said set of make contacts of said second relay; and
   detection means electrically connected to the series connected sets of make contacts and to the series connected sets of break contacts for detecting when one of said sets of make or break contacts is in an improper open or closed condition as an indication that the contacts of a set of main contacts have fused together.

3. A relay arrangement as set forth in claim 2, wherein said detection means outputs an emergency stop signal in response to said indication.

4. A relay arrangement as set forth in claim 2, wherein said main sets of contacts are cooperable to control a machine tool operation.

* * * * *